United States Patent [19]

Czichy

[11] Patent Number: 4,591,527

[45] Date of Patent: May 27, 1986

[54] COMPOSITE FOIL FROM WHICH LAYER AREAS HAVING METALLIC LUSTER ARE TRANSFERRED ONTO A BASE

[75] Inventor: Eleonore Czichy, Augsburg, Fed. Rep. of Germany

[73] Assignee: Interletter AG, Zürich, Switzerland

[21] Appl. No.: 640,932

[22] Filed: Aug. 15, 1984

Related U.S. Application Data

[62] Division of Ser. No. 498,668, May 31, 1983, Pat. No. 4,477,312, which is a division of Ser. No. 281,287, Jul. 7, 1981, abandoned.

[30] Foreign Application Priority Data

Jul. 10, 1980 [DE] Fed. Rep. of Germany ....... 3026236

[51] Int. Cl.⁴ .......................... B32B 3/18; B41M 3/12
[52] U.S. Cl. .................................. 428/201; 428/187; 428/202; 428/209; 428/353; 428/354; 428/913; 428/914
[58] Field of Search ............................ 428/200–202, 428/209, 913, 914, 208, 187, 480; 156/233, 235, 238, 240, 249, 305, 629–634, 654–656, 659.1, 664–666, 234, 241, 277; 427/146–148, 259, 264, 270–272, 282, 294, 404, 419.1; 430/5, 11, 14, 15, 18

[56] References Cited

U.S. PATENT DOCUMENTS

| | | | |
|---|---|---|---|
| 1,888,154 | 11/1932 | Allen et al. | 427/148 |
| 3,089,800 | 5/1963 | Colfer et al. | 428/40 |
| 3,358,337 | 12/1967 | Schuchardt | 24/27 |
| 3,463,651 | 8/1969 | Warsager | 428/138 |
| 3,961,121 | 6/1976 | Warsager | 428/200 |
| 4,012,552 | 3/1977 | Watts | 428/914 |
| 4,242,378 | 12/1980 | Arai | 427/271 |
| 4,313,994 | 2/1982 | Kingston | 428/200 |

Primary Examiner—Bruce H. Hess
Attorney, Agent, or Firm—Toren, McGeady, Stanger, Goldberg & Kiel

[57] ABSTRACT

A composite foil from which metallically lustrous layer areas which have an image structure are to be transferred onto a base, with a carrier layer, with a lacquer layer on said carrier layer, with a metal layer on said lacquer layer and with an adhesive layer on said metal layer, wherein said lacquer layer (4) and said metal layer (8) are divided into areas which have the shape of the image structure, and wherein said carrier layer (2) can be detached from said lacquer layer (4) and the adhesive (14) which is located between the areas by pulling off said carrier layer at room temperature wherein the metal layer is formed from vapor deposited metal and adhesive (14) is a contact adhesive.

15 Claims, 2 Drawing Figures

COMPOSITE FOIL FROM WHICH LAYER AREAS HAVING METALLIC LUSTER ARE TRANSFERRED ONTO A BASE

This is a divisional application of application Ser. No. 498,668, filed May 31, 1983 now U.S. Pat. No. 4,477,312, which, in turn, is a continuation of application Ser. No. 281,287, filed July 7, 1981, now abandoned.

BACKGROUND OF THE INVENTION

1. Field of the Invention

The invention relates to a composite foil from which metallically lustrous layer areas which have an image structure are to be transferred onto a base. The composite foil has a carrier layer, with a lacquer layer on the carrier layer, with a metal layer on the lacquer layer and with an adhesive layer on the metal layer.

2. Description of the Prior Art

In a known composite foil of this type, the lacquer layer and the metal layer are continuous. By means of a heated die which has the image structure and is pressed on the carrier layer, the lacquer can be removed in part from the carrier layer, at the same areas the adhesive is activated and thus the metal layer is in these areas transferred to a base. Since for each image structure a separate die is required which—because it is heated to a relatively high temperature—must consist of metal, this technique is only economical for large requirements.

SUMMARY OF THE INVENTION

It is the task of the invention to specify a composite foil of the type described above which can also be used economically for small requirements.

The composite foil is characterized for the solution of this task in that the lacquer layer and the metal layer are divided into areas which have the shape of the image structure, and that the carrier layer can be removed from the lacquer layer and the adhesive which is located between the two areas by pulling off the carrier layer at room temperature.

When using this composite foil, the adhesive layer is merely pressed on the base, perhaps with a creaser, and then the carrier layer is pulled off. The composite foil carries the image structure. This image structure however can be produced in a very simple manner. A preferred method is characterized in that a continuous lacquer layer is applied on the carrier layer, followed by an optional continuous tinted layer, then a metal layer, and then a solvent-resistant layer which is divided into areas that have the shape of the image structure. Then the metal of the metal layer, and, if applicable, the material of the tinted layer, and the lacquer of the lacquer layer between the areas are removed by means of at least one solvent and the adhesive layer is applied.

Advantageous embodiments of the invention are described in the sub-claims 2 to 10 and 12 to 14.

The invention is explained below with the aid of an exemplified embodiment, referring to the enclosed drawing:

DESCRIPTION OF THE PREFERRED EMBODIMENT

Figure 1:
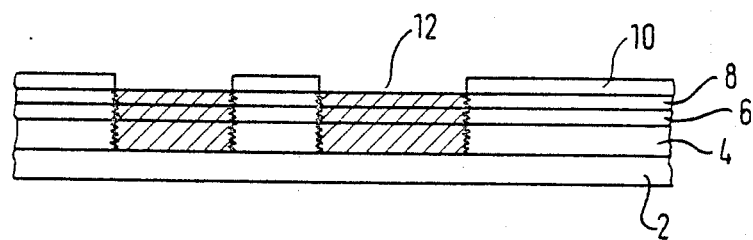
FIG. 1 shows a composite foil in cross section in the first phases of its production.
Figure 2:
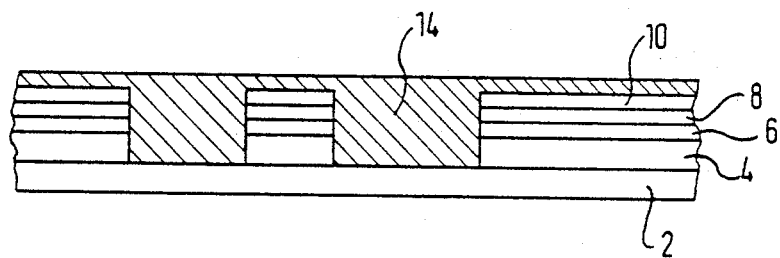
FIG. 2 shows the completed composite foil in cross section.

On a polyester foil 2 first a continuous layer 4 of lacquer is applied from which the foil 2 is to be pulled off in the cold state. When using a foil 2 of polyethylene a vinyl lacquer has proven to be advantageous which was dissolved in a mixture of acetone and butanol 2. Onto the layer 4 a continuous layer 6 was applied which is transparent as is the layer 4 but tinted. This layer 6 may be a pigmented lacquer based on vinyl chloride/vinyl acetate. If no tinting is desired, the layer 6 may be omitted. The layer 6 may also be omitted when the layer 4 is tinted. Onto the continuous layer 6 a continuous metal layer 8, perhaps of aluminum, was applied, e.g. by steaming the layer on. Such a metal layer may also be provided with tinting additives.

An image structure 10 was applied onto the continuous layer 8 by means of printing ink or by means of a light-hardened emulsion. The image structure 10 thus left the areas 12 blank. The aluminum layer could be removed in these areas 12 by means of a suitable solvent, e.g. soda lye. A 5% vinegar essence may be used to stop the removal process and to neutralize the soda lye. Subsequently the layer areas 6 and 4 can be removed with suitable solvents. Once this has been accomplished, the image structure is coated with a contact adhesive 14. (In the figures of course the thickness ratios are not shown in correct scale, but are shown in such a way that the structure of the layers becomes clear.)

I claim:

1. In a composite foil from which metallically lustrous layer areas which have an image structure are to be transferred onto a base, with a carrier layer, with a lacquer layer on said carrier layer, with a metal layer on said lacquer layer and with an adhesive layer on said metal layer, the improvement which comprises said lacquer layer (4) and said metal layer (8) being divided into areas which have the shape of the image structure, and wherein said carrier layer (2) can be detached from said lacquer layer (4) and the adhesive (14) which is located between the areas by pulling off said carrier layer at room temperature wherein the metal layer is formed from vapor deposited metal and adhesive (14) is a contact adhesive.

2. The composite foil of claim 1, wherein between said metal layer 8 and said lacquer layer 4 a layer 6 is located which is tinted in the same areas.

3. The composite foil of claim 2, wherein the basic material of said tinted layer 6 consists of a vinyl chloride-vinyl acetate copolymer.

4. The composite foil of claim 2 wherein said carrier layer 2 consists of a polyester foil.

5. The composite foil of claim 2 wherein said lacquer layer 4 consists of vinyl lacquer.

6. The composite foil of claim 2 wherein the tinting agent consists of a fat dyestuff, a dye which is soluble in alcohol, or an inorganic pigment.

7. The composite foil of claim 2 wherein said metal layer 8 consists of aluminum, copper, silver or chromium.

8. The composite foil of claim 1, wherein said lacquer layer 4 is tinted.

9. The composite foil of claim 8 wherein said carrier layer 2 consists of a polyester foil.

10. The composite foil of claim 8 wherein said lacquer layer 4 consists of vinyl lacquer.

11. The composite foil of claim 8 wherein the tinting agent consists of a fat dyestuff, a dye which is soluble in alcohol, or an inorganic pigment.

12. The composite foil of claim 8 wherein said metal layer 8 consists of aluminum, copper, silver or chromium.

13. The composite foil of claim 1 wherein said carrier layer 2 consists of a polyester foil.

14. The composite foil of claim 1 wherein said lacquer layer 4 consists of vinyl lacquer.

15. The composite foil of claim 1 wherein said metal layer 8 consists of aluminum, copper, silver or chromium.

* * * * *